(12) United States Patent
Watanabe et al.

(10) Patent No.: US 8,649,234 B2
(45) Date of Patent: Feb. 11, 2014

(54) SEMICONDUCTOR MEMORY DEVICE

(75) Inventors: Toshifumi Watanabe, Yokohama (JP); Hidetoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 13/285,181

(22) Filed: Oct. 31, 2011

(65) Prior Publication Data

US 2012/0206970 A1 Aug. 16, 2012

(30) Foreign Application Priority Data

Feb. 14, 2011 (JP) ................................ 2011-028664

(51) Int. Cl.
*G11C 7/00* (2006.01)
(52) U.S. Cl.
USPC .................. 365/194; 365/233.11; 365/233.12
(58) Field of Classification Search
USPC ............... 365/194, 230.01, 230.06, 203, 236, 365/233.11, 233.12, 233.1, 189.05, 189.06
See application file for complete search history.

(56) References Cited

U.S. PATENT DOCUMENTS

| | | | |
|---|---|---|---|
| 2006/0224789 A1* | 10/2006 | Cho et al. | ......................... 710/52 |
| 2008/0101129 A1 | 5/2008 | Hara et al. | |
| 2009/0319840 A1 | 12/2009 | Hara et al. | |

FOREIGN PATENT DOCUMENTS

| | | |
|---|---|---|
| JP | 10-125074 | 5/1998 |
| JP | 2005-332496 | 12/2005 |
| JP | 2008-112546 | 5/2008 |
| JP | 2009-26370 | 2/2009 |
| JP | 2010-9642 | 1/2010 |

OTHER PUBLICATIONS

Japanese Office Action issued Dec. 20, 2011 in Patent Application No. 2011-028664 with English Translation.

* cited by examiner

*Primary Examiner* — Alexander Sofocleous
*Assistant Examiner* — Hien Nguyen
(74) *Attorney, Agent, or Firm* — Oblon, Spivak, McClelland, Maier & Neustadt, L.L.P.

(57) ABSTRACT

According to one embodiment, an interface includes first to third input circuits, delay and selection circuits. The first input circuit outputs an active first internal signal in response to an active first control signal received by a memory device. The second input circuit outputs an active second internal signal in response to an active second control signal received by the device while the device is receiving the active first control signal. The delay circuit outputs a selection signal in first or second states after the elapse of a first period from inactivation or activation of the first control signal. The selection circuit outputs the first and second internal signals as an enable signal while receiving the selection signal of the first and second states. The third input circuit outputs an input signal received from the outside from the interface to inside the device while receiving the active enable signal.

13 Claims, 11 Drawing Sheets

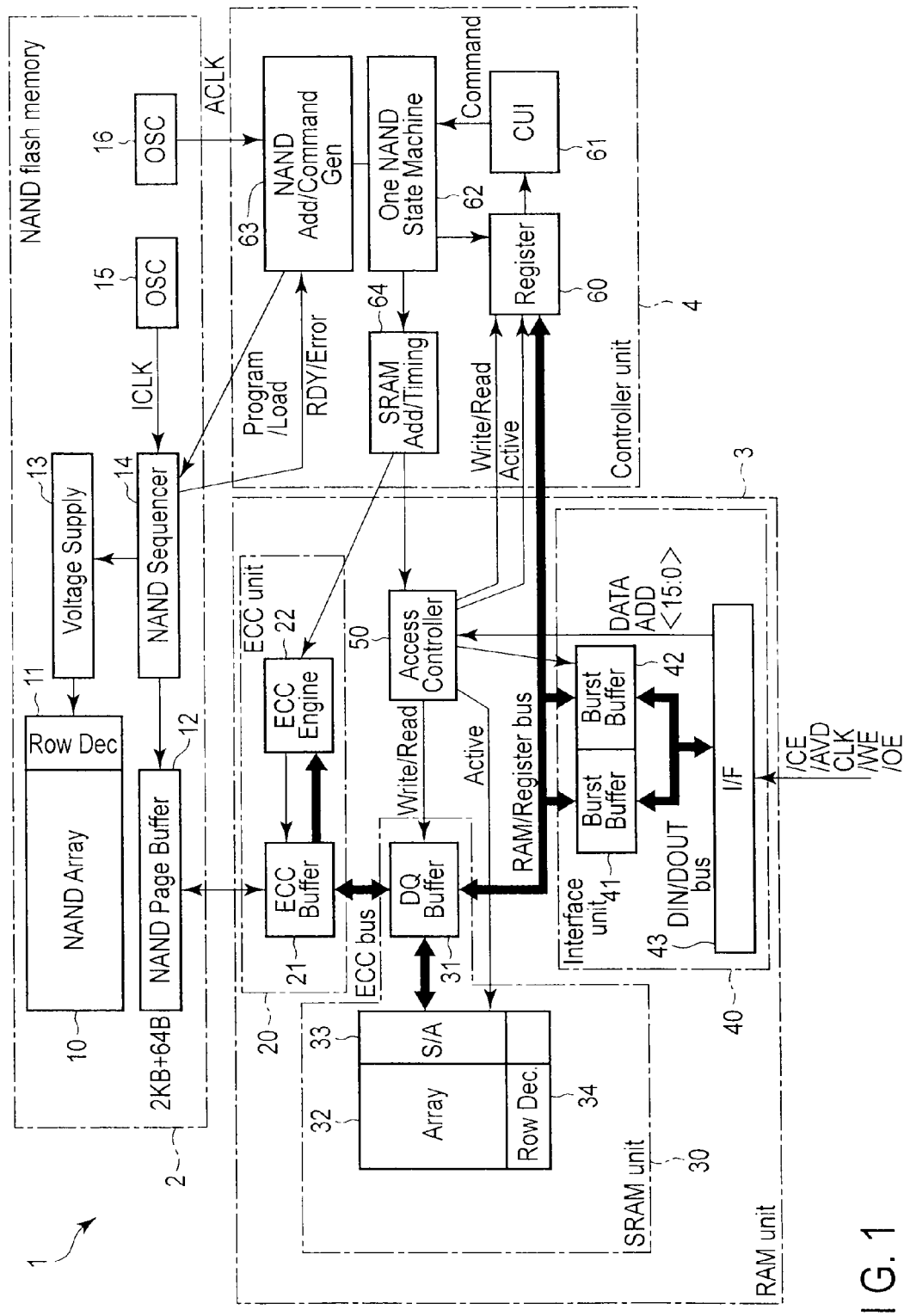
F I G. 1

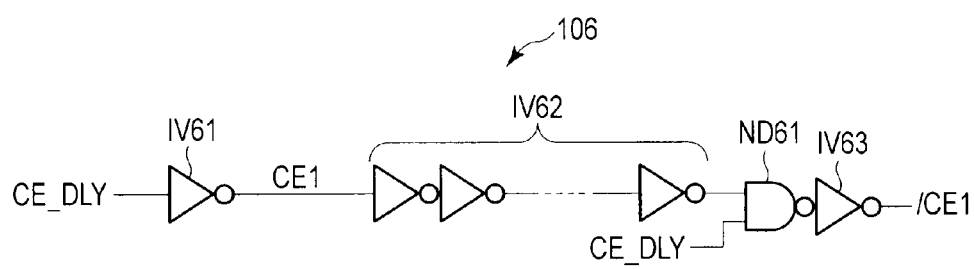
F I G. 9
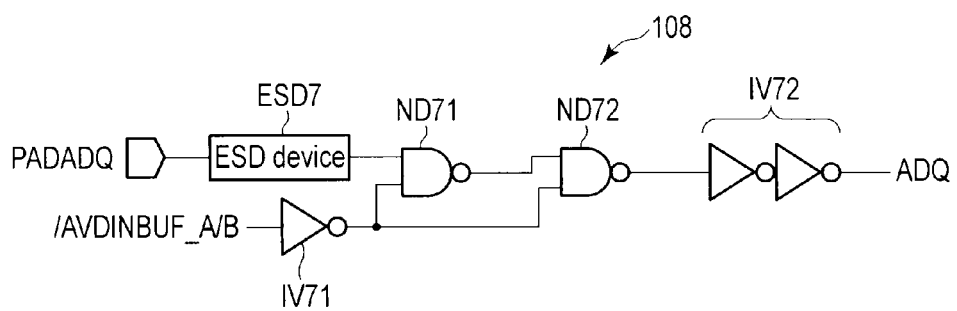
F I G. 10

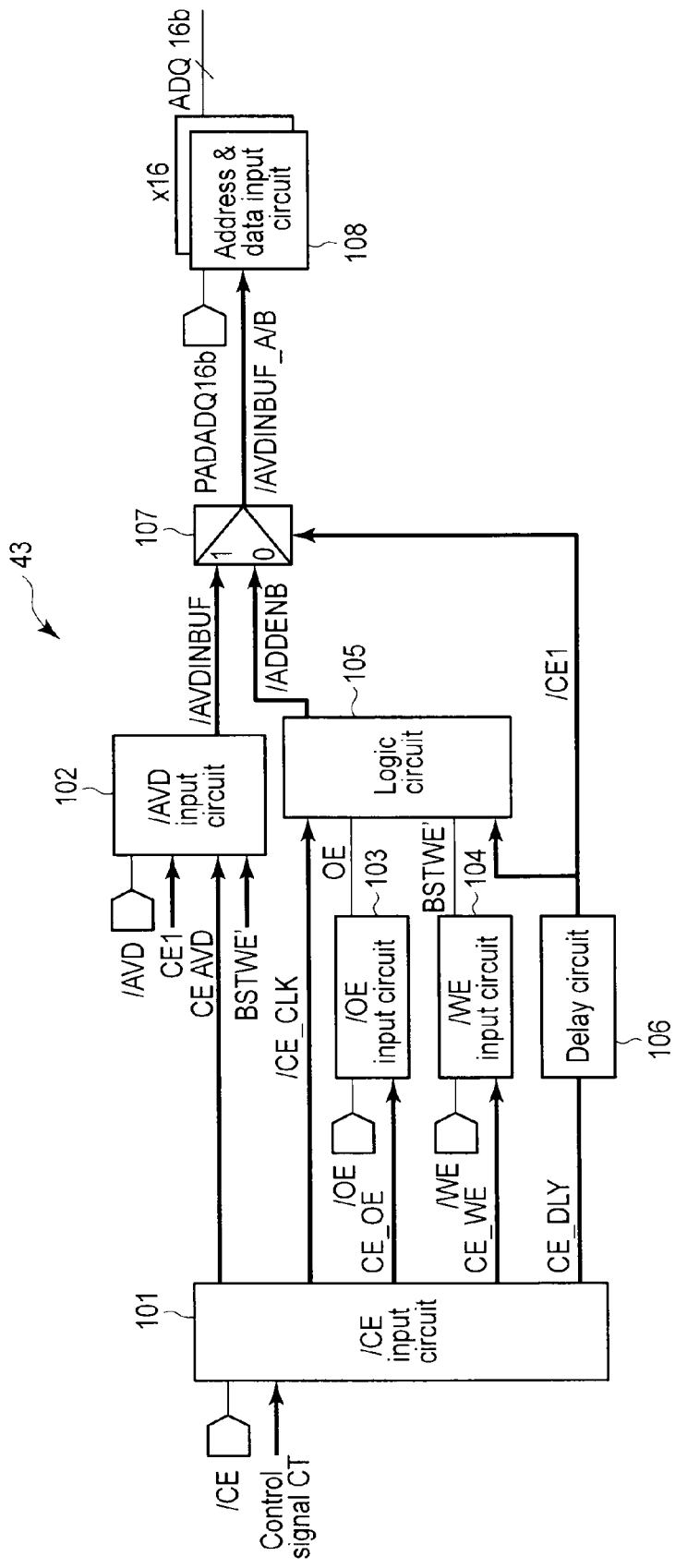
F I G. 13

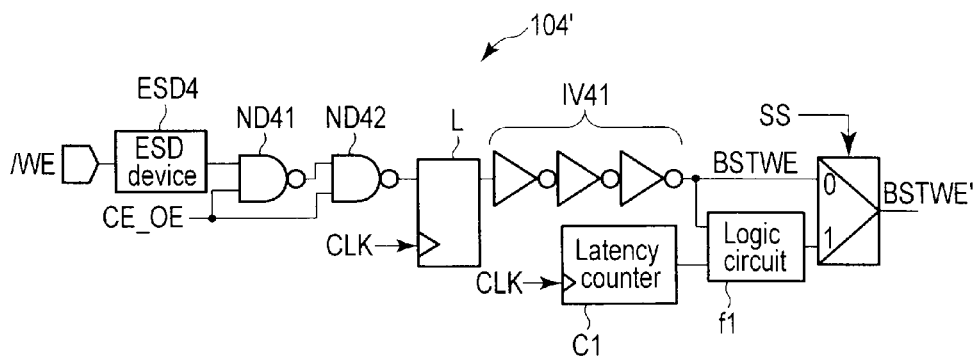
F I G. 14
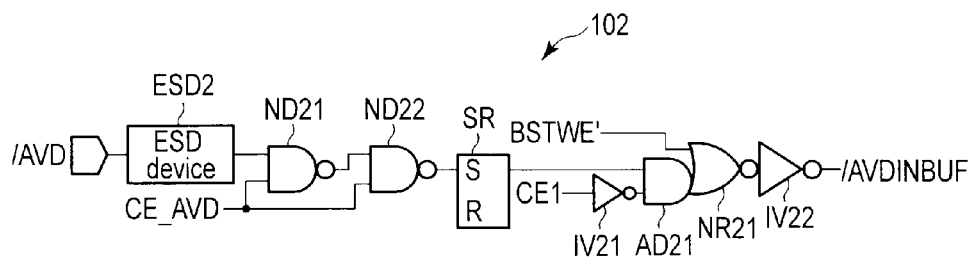
F I G. 15
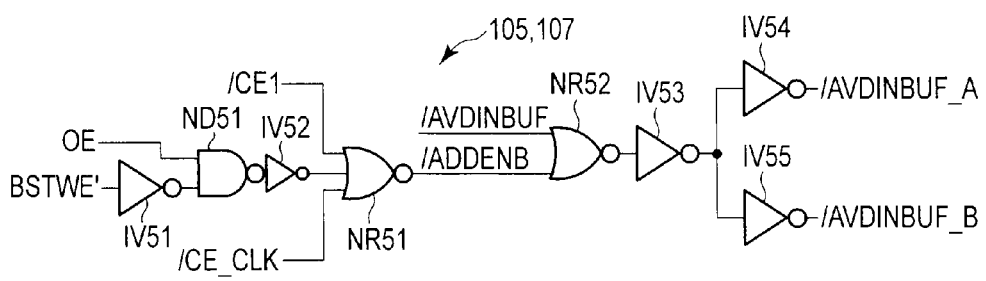
F I G. 16

SEMICONDUCTOR MEMORY DEVICE

CROSS-REFERENCE TO RELATED APPLICATIONS

This application is based upon and claims the benefit of priority from prior Japanese Patent Application No. 2011-028664, filed Feb. 14, 2011, the entire contents of which are incorporated herein by reference.

FIELD

Embodiments described herein relate generally to a semiconductor memory device.

BACKGROUND

As a nonvolatile semiconductor memory, the NAND flash memory is widely known. The NAND flash memory simultaneously stores data of a predetermined size in memory cells. It also simultaneously reads the data of a predetermined size from memory cells.

Blocks having respective functions are mounted on a semiconductor chip to form a system, which enables a semiconductor device to have desired features. Such function blocks include the NAND flash memory and a random access memory (RAM), for example. There is a demand to further accelerate operation of such a system.

BRIEF DESCRIPTION OF THE DRAWINGS

FIG. 1 illustrates a block diagram of a semiconductor memory device according to a first embodiment.

FIG. 9 illustrates a circuit diagram of a delay circuit.

FIG. 10 illustrates a circuit diagram of an address & data input circuit.

FIG. 13 illustrates a block diagram of an interface of a semiconductor memory device according to a second embodiment.

FIG. 14 illustrates a circuit diagram of a /WE input circuit of the second embodiment.

FIG. 15 illustrates a circuit diagram of a /AVD input circuit of the second embodiment.

FIG. 16 illustrates a circuit diagram of a logic circuit and a switching circuit of the second embodiment.

DETAILED DESCRIPTION

Figure 2:
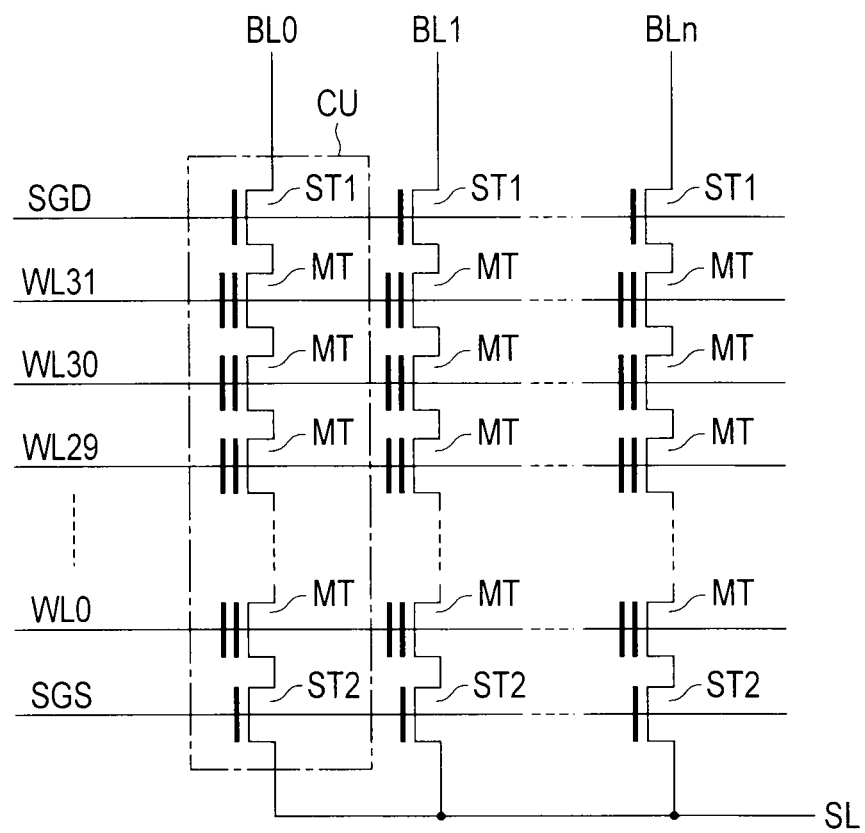
FIG. 2 illustrates a circuit diagram of a memory cell array of the NAND flash memory.

In general, according to one embodiment, a semiconductor memory device includes a memory cell and an interface. The interface includes first, second, and third input circuits, a delay circuit, and a selection circuit. The first input circuit outputs an active first internal signal in response to an active first control signal received by the semiconductor memory device. The second input circuit outputs an active second internal signal in response to an active second control signal received by the semiconductor memory device while the semiconductor memory device is receiving the active first control signal. The delay circuit outputs a selection signal in a first state or a second state after the elapse of a first period from when the first control signal becomes inactive or active, respectively. The selection circuit outputs the first internal signal as an enable signal while receiving the selection signal of the first state, and outputs the second internal signal as the enable signal while receiving the selection signal of the second state. The third input circuit outputs an input signal received from the outside of the semiconductor memory device from the interface to the inside of the semiconductor memory device while receiving the active enable signal.

The inventor has obtained the following findings in the course of development of the embodiments.

(Example for Reference)

Various signals for controlling a semiconductor memory device are input to the semiconductor memory device. Such signals include a signal /CE (the sign "/" represents a negative logic), a signal /AVD, address ADD, a clock CLK, etc. Appropriately combining these signals enables the semiconductor device to perform desired operations. Some signals must be active before other signals based on their functions. For example, in order for the semiconductor memory device to take in the address ADD, the signal /CE first needs to be activated, and then the signal /AVD needs to be activated. Subsequently, when the address ADD is input to the semiconductor memory device while a signal generated with the signals /CE and /AVD both active is output, the address ADD can be taken in by the semiconductor memory device.

Further accelerated operations are required for the semiconductor memory device as described above. The fulfillment of this request is hindered by the time taken by the aforementioned series of processes in order for the semiconductor memory device to take in the address ADD. Therefore, in order to reduce the time for this process, it may be possible to omit the input of the active signal /AVD. In particular, it may be possible to allow the address ADD to be taken in so long as the active signal /CE is being input. Such a control can reduce the time for waiting for the signal /AVD to become active.

Such a control, however, causes the following problem. The undesired phenomenon does not occur so long as the address ADD is allowed to assume only one of high and low level values during the period of the active signal /CE, which serves as a control signal for an address input circuit. In fact, however, a signal having an intermediate potential may flow in a line transmitting address during the period of the active signal /CE due to, for example, floating of this line. If the address ADD of such a potential is input to the semiconductor device, this intermediate potential may turn on all the n-type metal oxide semiconductor (MOS) and p-type MOS transistors in an input circuit in the address-transmitting line to allow a penetration current to flow between the power supply and the earth.

Embodiments configured based on such knowledge will now be described with reference to drawings. Components which have substantially the same functions and configurations will be referred to with the same reference numerals and repetitive descriptions will be given only when required. Note that the drawings are merely illustrative. Embodiments described in the following illustrate devices and methods for realizing the technical idea of the embodiments, and the technical idea of the embodiments does not limit the materials of component parts, forms, structures, arrangement, etc. to the following ones. The technical idea of the embodiments may be variously changed in accordance with the scope of the claims.

(First Embodiment)

<1. Overall Configuration of Memory System>

FIG. 1 is a block diagram of the semiconductor memory device (memory system) according to a first embodiment. As shown, the memory system 1 according to the first embodiment includes a NAND flash memory 2, a RAM unit 3, and a controller 4. The NAND flash memory 2, RAM unit 3, and controller 4 are formed on the same semiconductor substrate, and are integrated into one chip. These blocks will be described in detail.

<1-1. NAND Flash Memory 2>

The flash memory 2 serves as a main storage of the memory system 1. As shown, the flash memory 2 includes a memory cell array 10, a row decoder 11, a page buffer 12, a voltage generation circuit 13, a sequencer 14, and oscillators 15 and 16.

The memory cell array 10 includes memory cell transistors. FIG. 2 is a circuit diagram of the memory cell array 10. As shown, the memory cell array 10 includes memory cell units CU. Each memory cell unit CU includes, e.g., 32 memory cell transistors MT and select transistors ST1 and ST2. The memory cell transistor MT includes a stacked gate structure, which includes a charge storage layer (e.g., a floating gate) formed on a semiconductor substrate with a gate insulation film therebetween, and a control gate formed on the charge storage layer with an inter-gate insulation layer therebetween. The memory cell transistor MT may also be a metal oxide nitride oxide silicon (MONOS) structure, in which the electrons are trapped in a nitride layer.

Current paths of adjacent memory cell transistors MT are serially connected. The drain of one of the serially-connected memory cell transistors MT at one end is connected to a source of the select transistor ST1, and a source of the transistor at the other end is connected to the drain of the select transistor ST2. Control gates of the memory cell transistors MT in the same row are connected to the same one of the word lines WL0 to WL31. Gates of select transistors ST1 or ST2 in the same row are connected to a select gate line SGD or SGS, respectively. Each drain of select transistors ST1 is connected to one of the bit lines BL0 to BLn (n being a natural number). The sources of the select transistors ST2 are commonly connected to the source line SL. The memory cell transistors MT connected to the same one of word lines WL0 to WL31 configure a page. Data writing or reading are simultaneously performed to more than one memory cell transistor MT. Data in more than one page are configured to be erased simultaneously, and such a unit of data erasure is called a memory block.

Each memory cell transistor MT can hold one-bit data based on, e.g., its threshold voltage determined in accordance with the number of electrons in the floating gate. It is also possible to make memory cell transistors MT hold data of two bits or more by controlling threshold voltages more finely.

Referring again to FIG. 1, description will be given of the configuration of the flash memory 2. The row decoder 11 selects the word lines WL0 to WL31 and also selects the gate lines SGD and SGS for writing, reading or erasing data. It also applies the required voltage to the selected word lines WL0 to WL31 and the select gate lines SGD and SGS.

The page buffer 12 is configured to hold data of the same size as the page of the memory cell array 11 (e.g., 2048+64 bytes). That is, the page buffer temporarily holds one-page-size data read from the memory cell array 11 in data reading, and one-page-size data to be written into the memory cell array 11 in data writing. The page buffer 12 outputs 64-bit-wide data. The page buffer 12 is configured to output data to a NAND bus through a bus and receive data of such size from the NAND bus. The NAND bus is a path for transferring data between the page buffer 12 and RAM unit 3.

The voltage generation circuit 13 generates the voltage required for writing, reading or erasing data, and supplies, e.g., the row decoder 11 with the generated voltage.

The sequencer 14 manages the overall operation of the flash memory 2. That is, when the sequencer 14 receives a program instruction (Program), a loading instruction (Load), or an erasure instruction (not shown) from the controller 4, it performs a sequence for programming, reading or erasing data. Following the sequence, it controls the operation of the voltage generation circuit 13 or the page buffer 12.

The oscillator 15 generates an internal clock ICLK, and supplies it to the sequencer 14. The sequencer 14 operates in synchronization with this internal clock ICLK. The sequencer 14 also generates a clock BCLK from the internal clock ICLK, and supplies it to the NAND bus.

The oscillator 16 generates an internal clock ACLK, and supplies it to the controller 4 and RAM unit 3. The Internal clock ACLK is used as the reference for operation of the controller 4 and RAM unit 3.

<1-2. RAM Unit 3>

Referring again to FIG. 1, the RAM unit 3 will now be described. The RAM unit 3 mainly includes an ECC unit 20, a static random access memory (SRAM) 30, an interface unit 40, and an access controller 50. In the memory system 1, the flash memory 2 serves as a primary storage, and the SRAM unit 30 of the RAM unit 3 a buffer. Therefore, in order to read data from the flash memory 2 to the outside, first the data read from the memory cell array 10 of the flash memory 2 is stored in the SRAM unit 30 of RAM unit 3 through the page buffer 12 and the NAND bus. The data stored in the SRAM unit 30 is transferred to the interface unit 40, and is then output outside. In contrast, in order to store data in the flash memory 2, first the data received from the outside is stored in the SRAM unit 30 in RAM unit 3 through the interface unit 40. The data stored in the SRAM unit 30 is then transferred to the page buffer 12, and written in the memory cell array 10.

In the following description, operation to read the data from the memory cell array 10 and then transfer the data to the SRAM unit 30 through the page buffer 12 is referred to as "to load" data. Operation to transfer the data from the SRAM unit 30 to the interface 43 through burst buffers 41 and 42 (to be described later) in the interface unit 40 is referred to as "to read" data.

Operation to transfer the data to be stored in the flash memory 2 from the interface 43 to the SRAM unit 30 through the burst buffers 41 and 42 is referred to as "to write" data. Operation to transfer the data in the SRAM unit 30 to the page buffer 12 and then write in the memory cell array 10 is referred to as "to program" data.

<1-2-1. ECC Unit 20>

The ECC unit 20 performs the ECC processing. In particular, it detects and corrects errors in the data read from the flash memory 2 in data loading, and generates parities for the data to be programmed in data programming. The ECC unit 20 includes an ECC buffer 21 and an ECC engine 22.

The ECC buffer 21 is coupled to the page buffer 12 by the NAND bus, and coupled to the SRAM unit 30 by the ECC bus. The ECC buffer 21 temporarily stores data for the ECC processing, which involves correcting errors in data loading, or generating parities in data programming. The ECC buffer 21 is coupled to the NAND bus of 64-bit width. The ECC engine 22 uses the data held at the ECC buffer 21 to perform the ECC processing.

<1-2-2. SRAM Unit 30>

The SRAM unit 30 serves as a buffer memory for the flash memory 2. The SRAM unit 30 includes a DQ buffer 31, a memory cell array 32, a sense amplifier 33, and a row decoder 34. The DQ buffer 31 temporarily stores data destined for the memory cell array 32, or data received from the memory cell array 32 in data loading, reading, writing, and programming. The memory cell array 32 includes SRAM cells configured to hold data. The sense amplifier 33 senses and amplifies the data received from the SRAM cells, and also serves as a load in writing data held in the DQ buffer 31 to the SRAM cells. The row decoder 34 selects specific word lines in the memory cell array 32.

<1-2-3. Interface Unit 40>

The interface unit 40 includes the burst buffers 41 and 42 and an interface 43. The interface 43 inputs or outputs from or to the host device outside the memory system 1 various signals such as data, control signals, and an address, etc. Examples of the control signals include a chip enable signal /CE for enabling the whole memory system 1, an address valid signal /AVD for latching the address, a clock CLK for the burst read, a write enable signal /WE for enabling data writing, and an output enable signal /OE for enabling the data output outside, etc. The interface 43 also transfers to the access controller 50 the control signals relating to a read request, a load request, a write request, a program request of data received from the host device, etc. The burst buffers 41 and 42 are coupled to the interface 43 by, e.g., a DIN/DOUT bus of 16-bit width. The burst buffers 41 and 42 are configured to transfer data to and from the DQ buffer 31, the controller 4 and the interface 43. The burst buffers 41 and 42 also temporarily hold the data received from the host device, and the data received from the DQ buffer 31.

<1-2-4. Access Controller 50>

The access controller 50 receives the control signals and the address from the interface 43. It controls the SRAM unit 30 and controller 4 to perform the operation to fulfill requests from the host device. More specifically, the access controller 50 activates either of the SRAM unit 30 and the register 60 (to be described later) of the controller 4 based on the request from the host device. Then, it issues a write or read command of the data (Write/Read) to the SRAM unit 30 or register 60. With such control, the SRAM unit 30 and controller 4 start the operation.

<1-3. Controller 4>

The controller 4 manages the overall operation of the memory system 1. The controller 4 includes the register 60, a command user interface 61, a state machine 62, an address/command generation circuit 63, and an address/timing generation circuit 64.

The register 60 is for setting up the operating state of a function based on the command from the access controller 50. More specifically, the register 60 holds the load command and program command, for example.

The command user interface 61 recognizes that a function execution command has been received by the memory system 1 through hold of a predetermined command at the register 60. Then, it outputs an internal command signal (Command) to the state machine 62.

The state machine 62 controls a sequence operation within the memory system 1 based on the internal command signal received from the command user interface 61. Functions supported by the state machine 62 include various ones such as a load, program, and erasure. The state machine 62 controls the operation of the flash memory 2 and RAM unit 3 to perform these functions.

The address/command generation circuit 63 controls the operation of the flash memory 2 based on the control by the state machine 62. More specifically, it generates an address and commands (Program/Load), etc. and outputs them to the flash memory 2. The address/command generation circuit 63 outputs these address and commands in synchronization with the internal clock ACLK generated by the oscillator 16.

The address/timing generation circuit 64 controls the operation of the RAM unit 3 based on the control by the state machine 62. More specifically, it issues a necessary address and command in RAM unit 3, and outputs them to the access controller 50 and ECC engine 22.

<1-4. Operation of Memory System 1>

The operation of the memory system 1 will now be briefly described. Transfer of data between the flash memory 2 and host device is carried out via the SRAM unit 30 as described above. In order for the host device to store the data in the flash memory 2 of the memory system 1, the data is first stored in the SRAM unit 30 in accordance with the write command and address of the SRAM unit 30 from the host device. Then, the data stored in the SRAM unit 30 is programmed in the flash memory 2 in units of pages in accordance with the program command and address of the flash memory 2 from the host device.

In order for the host device to read the data in the flash memory 2, the data is first read from the flash memory 2 and then stored in the SRAM unit 30 in accordance with the load command, address of the flash memory 2, and address of the SRAM unit 30 from the host device. The data held in the SRAM unit 30 is then read to the host device via the interface unit 40 in accordance with the read command and address of the SRAM unit 30 from the host device.

An example of the operation for loading will be briefly described. The host device first inputs the addresses of the flash memory 2 and the SRAM from which the data will be loaded to the interface unit 40, and then the load command. Responding to this command, the access controller 50 holds the addresses and command in the register 60. The command user interface 61 issues the internal command signal when it detects that the command has been held at the register 60. For the loading, the load command is issued.

The state machine 62 is activated when it receives the load command from the user interface 61. The state machine 62 carries out necessary initialization of the circuit blocks, and then requests the address/command generation circuit 63 to issue a sense command to the flash memory 2. Then, the address/command generation circuit 63 issues the sense command to the sequencer 14 in order to sense the data at the address set in the register 60.

The sequencer 14 is activated when it receives the sense command from the address/command generation circuit 63. The sequencer 14 carries out initialization necessary in the flash memory 2, and then performs the sensing of the data at the specified address. That is, the sequencer 14 controls the voltage generation circuit 13, row decoder 11, sense amplifier, and page buffer 12 to store the sensed data in the page buffer 12. The sequencer 14 then notifies the state machine 62 of the completion of the sensing.

The state machine 62 requests the address/command generation circuit 63 to issue a transfer command to the flash memory 2. In response to this command, the address/command generation circuit 63 outputs the transfer command to the sequencer 14. Upon receipt of the transfer command, the sequencer 14 controls the page buffer 12 and NAND bus to transfer the data in the page buffer 12 to the ECC buffer 21 via the NAND bus.

The state machine 62 supplies an error-correction start control signal to the ECC unit 20. In response to this signal, the ECC unit 20 performs the ECC processing. Then, the ECC-processed data is transferred from the ECC unit 20 to the DQ buffer 31 via the ECC bus. By instructions from the access controller 50, the data in the DQ buffer 31 is then written into the memory cell array 32 of the SRAM unit 30. The data loading has been completed by the above steps. The host device then issues the read command through the interface unit 40 to read the data written in the memory cell array 32.

<2. Interface>

Figure 3:
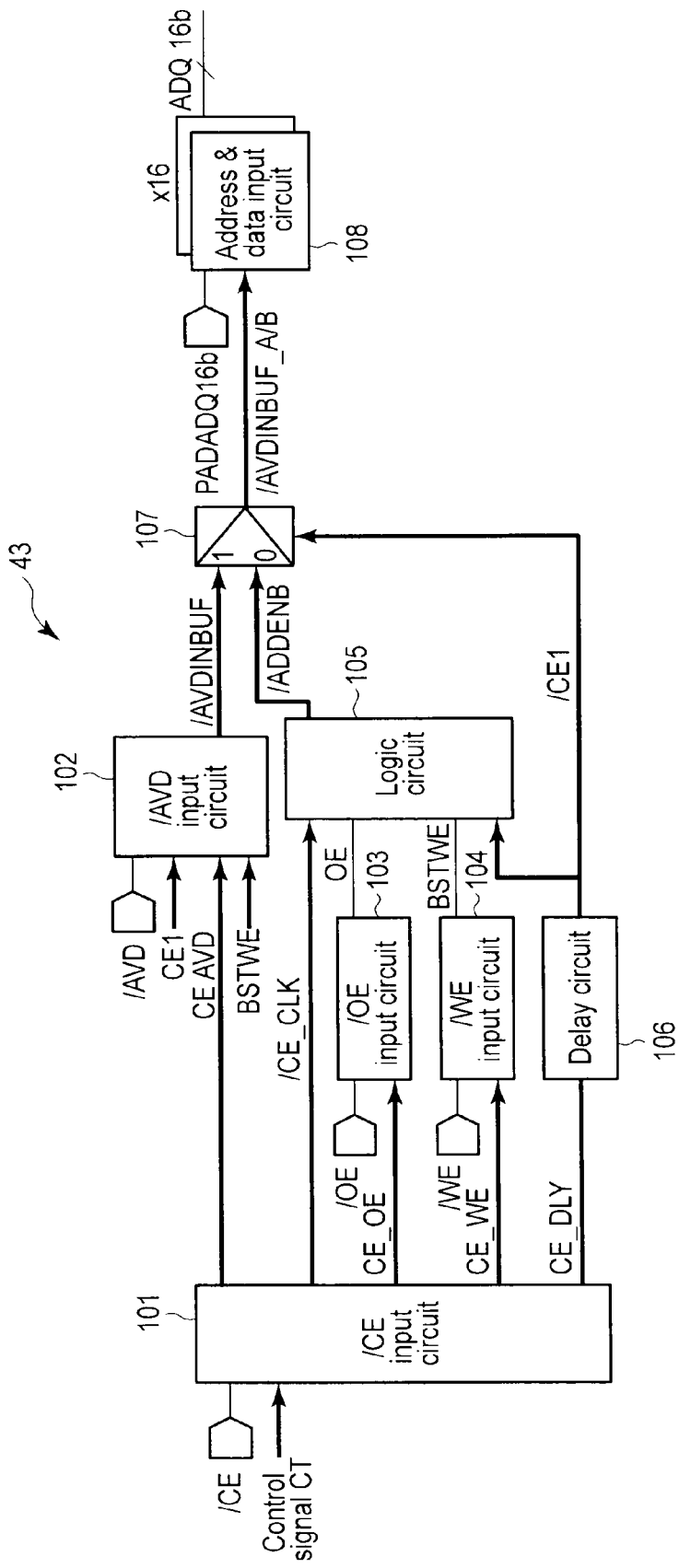
FIG. 3 illustrates a block diagram of an interface of the semiconductor memory device according to the first embodiment.

The interface 43 will now be described in detail with reference to FIGS. 3 to 12. FIG. 3 illustrates a block diagram of the interface of the semiconductor memory device according to the first embodiment. As shown in FIG. 3, the interface 43 has a /CE input circuit 101. The /CE input circuit 101 receives the chip enable signal /CE and a control signal CT from the outside of the memory system 1. When the /CE input circuit 101 receives the signal /CE while it is receiving the control signal CT, it outputs signals CE_AVD, /CE_CLK, CE_OE, CE_WE, and CE_DLY delayed by respective predetermined periods from the reception of the signal /CE.

The signal CE_AVD is input to a /AVD input circuit 102. The active signal CE_AVD enables the /AVD input circuit 102. The /AVD input circuit 102 also receives the address valid signal /AVD from the outside of the memory system 1 as well as a signal CE1 and signal BSTWE. The signals CE1 and BSTWE are generated by a delay circuit 106 and /WE input circuit 104, respectively, which will be described below. The /AVD input circuit 102 generates a signal /AVDINBUF from the signals /AVD, CE1, and BSTWE while the /AVD input circuit 102 is enabled. The active signal /AVDINBUF enables an address & data input circuit 108, which will be described below. The signal /AVDINBUF becomes active and inactive in response to the signal /AVD becoming active and inactive, respectively, so long as the signal BSTWE is inactive. The signal /AVDINBUF is active while the signal BSWTE is active.

The signal CE_OE is input to a /OE input circuit 103. The active signal CE_OE enables the /OE input circuit 103. The /OE input circuit 103 also receives the output enable signal /OE from the outside of the memory system 1. When the enabled /OE input circuit 103 receives the signal /OE, it outputs the signal OE, which is delayed from the signal /OE by a predetermined period.

The signal CE_WE is input to a /WE input circuit 104. The active signal CE_WE enables the /WE input circuit 104. The /WE input circuit 104 also receives the write enable signal /WE from the outside of the memory system 1. When the enabled /WE input circuit 104 receives the signal /WE, it latches the signal /WE and outputs it as a signal BSTWE.

The signals /CE_CLK, OE, and BSTWE are input to a logic circuit 105. The logic circuit 105 also receives a signal /CE1. The logic circuit 105 generates a signal /ADDENB from the signals /CE_CLK, OE, BSTWE, and /CE1, and outputs it. The signal /ADDENB is for controlling enabling of the address & data input circuit 108. The signal /ADDENB becomes active after the elapse of a predetermined period from the activation of the signal /CE while the signal /OE is inactive. The signal /ADDENB becomes inactive when the signal /OE becomes active.

The signal CE_DLY is input to the delay circuit 106. The delay circuit 106 generates the signal /CE1 from the signal CE_DLY and outputs it. The signal /CE1 is a delayed version of the signal CE_DLY.

The signals /AVDINBUF, /ADDENB, and /CE1 are input to a switching circuit 107. The switching circuit 107 outputs the signal /AVDINBUF or /ADDENB as signals /AVDINBUF_A and /AVDINBUF_B, respectively, based on the signal /CE1. The signals /AVDINBUF_A and /AVDINBUF_B are identical and are described as a signal /AVDINBUF_A/B herein and in the figures. More specifically, the switching circuit 107 outputs the signal /ADDENB while the signal /CE1 is low, and outputs the signal /ADDINBUF while the signal /CE1 is high.

The signal /AVDINBUF_A/B is input to the address & data input circuit 108. The active signal /AVDINBUF_A/B enables the address & data input circuit 108. The address & data input circuit 108 also receives a signal PADADQ from the outside of the memory system 1. The signal PADADQ is an address signal or a data signal, and has, e.g., 16 bits. Thus, in the memory system 1, the address and data signal are input and output from common pads. The address & data input circuit 108 includes a set of identical circuits as many as the number of bits of the address (for example, 16 bits). Each of the circuits receives one of the bits of the signal PADADQ. In this way, the enabled address & data input circuit 108 outputs the 16-bit signal PADADQ as the 16-bit signal ADQ. The signal ADQ is input to the access controller 50.

Figure 4:
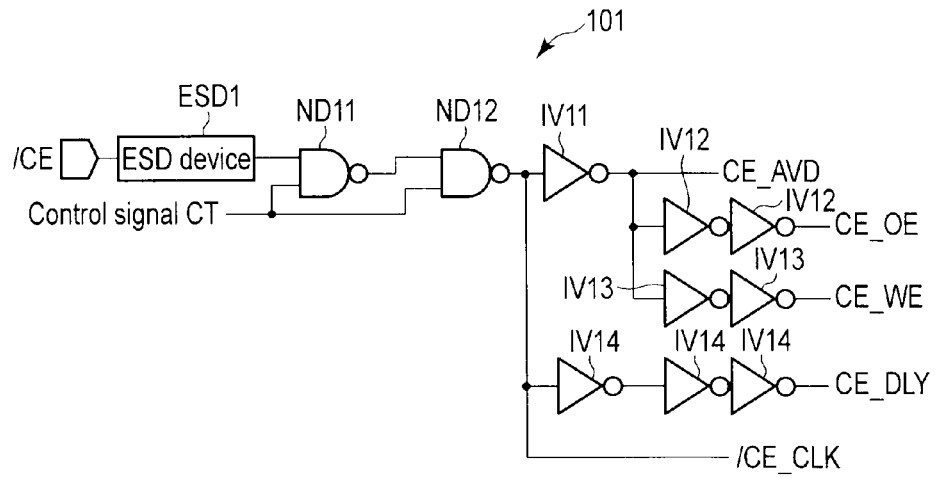
FIG. 4 illustrates a circuit diagram of a /CE input circuit.

Examples of the blocks in the block diagram of FIG. 3 will now be described with reference to FIGS. 4 to 10. FIG. 4 illustrates a circuit diagram of the /CE input circuit 101. As shown in FIG. 4, the signal /CE input from the pad is input to an ESD device ESD1. The output of the ESD device ESD1 is input to a NAND gate ND11. The NAND gate ND11 also receives the control signal CT. The output of the NAND gate ND11 is input to a NAND gate ND12. The NAND gate ND12 also receives the control signal CT. The output of the NAND gate ND12 serves as the signal /CE_CLK. The output of the NAND gate ND12 is also input to an inverter circuit IV11. The output of the inverter circuit IV11 serves as the signal CE_AVD. The output of the inverter circuit IV11 serves as the signal CE_OE after it passes through serially-coupled inverter circuits IV12 of a predetermined number (e.g., two). The output of the inverter circuit IV11 also serves as the signal CE_WE after it passes through serially-coupled inverter circuits IV13 of a predetermined number (e.g., two). The output of the NAND gate ND12 also serves as the signal CE_DLY after it passes through serially-coupled inverter circuits IV14 of a predetermined number (e.g., three).

Figure 5:
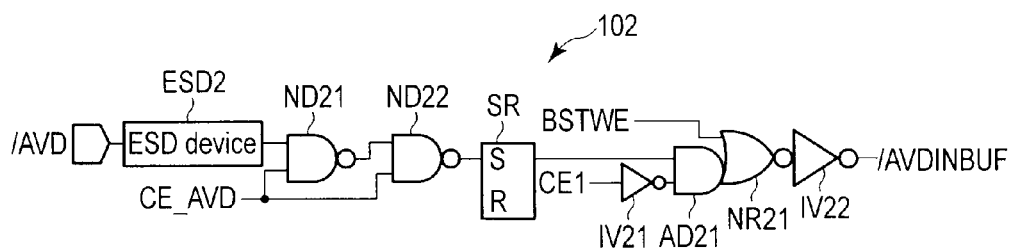
FIG. 5 illustrates a circuit diagram of a /AVD input circuit of the first embodiment.

FIG. 5 illustrates a circuit diagram of the /AVD input circuit 102. As shown in FIG. 5, the signal /AVD input from the pad is input to an ESD device ESD2. The output of the ESD device ESD2 is input to a NAND gate ND21. The NAND gate ND21 also receives the signal CE_AVD. The output of the NAND gate ND21 is input to a NAND gate ND22. The NAND gate ND22 also receives the signal CE_AVD. The output of the NAND gate ND22 is input to the set input of a set reset circuit SR. The output of the set reset circuit SR is input to an AND gate AD21. The AND gate AD21 also receives the inverted version of the signal CE1 from the inverter circuit 21. The output of the AND gate AD21 and the signal BSTWE are input to a NOR gate NR21. The output of the NOR gate NR21 serves as the signal /AVDINBUF after it passes through an inverter circuit IV22.

Figure 6:
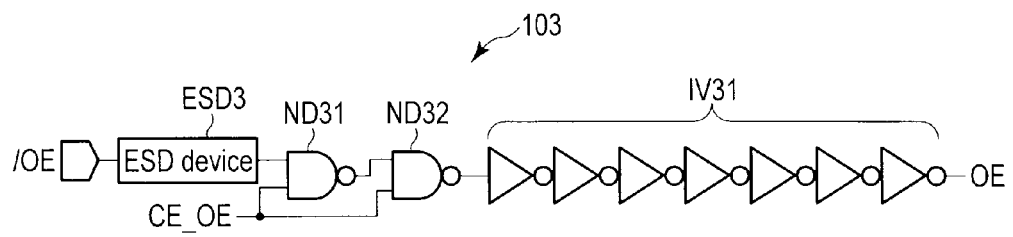
FIG. 6 illustrates a circuit diagram of a /OE input circuit.

FIG. 6 illustrates a circuit diagram of the /OE input circuit 103. As shown in FIG. 6, the signal /OE input from the pad is input to an ESD device ESD3. The output of the ESD device ESD3 is input to a NAND gate ND31. The NAND gate ND31 also receives the signal CE_OE. The output of the NAND gate ND31 is input to a NAND gate ND32. The NAND gate ND32 also receives the signal CE_OE. The output of the NAND gate 32 serves as the signal OE after it passes through serially-coupled inverter circuits IV31 of a predetermined number (e.g., seven).

Figure 7:
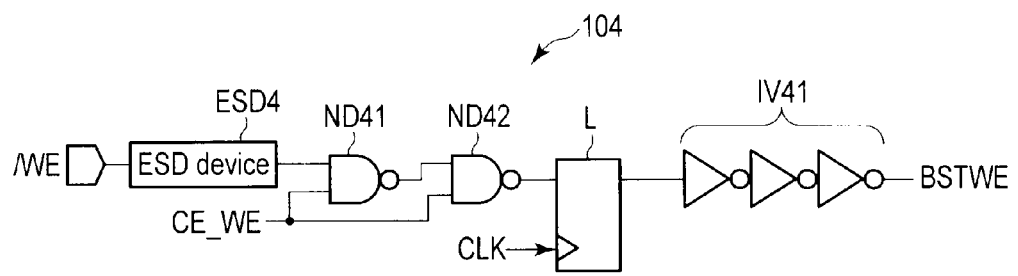
FIG. 7 illustrates a circuit diagram of a /WE input circuit of the first embodiment.

FIG. 7 illustrates a circuit diagram of the /WE input circuit 104. As shown in FIG. 7, the signal /WE input from the pad is input to an ESD device ESD4. The output of the ESD device ESD4 is input to a NAND gate ND41. The NAND gate ND41 also receives the signal CE_WE. The output of the NAND gate ND41 is input to a NAND gate ND42. The NAND gate ND42 also receives the signal CE_WE. The output of the NAND gate ND42 is input to a latch circuit L. The Latch circuit L receives the clock CLK as its control signal. The output of the latch circuit L serves as the signal BSTWE after it passes through serially-coupled inverter circuits IV41 of a predetermined number (e.g., three).

Figure 8:
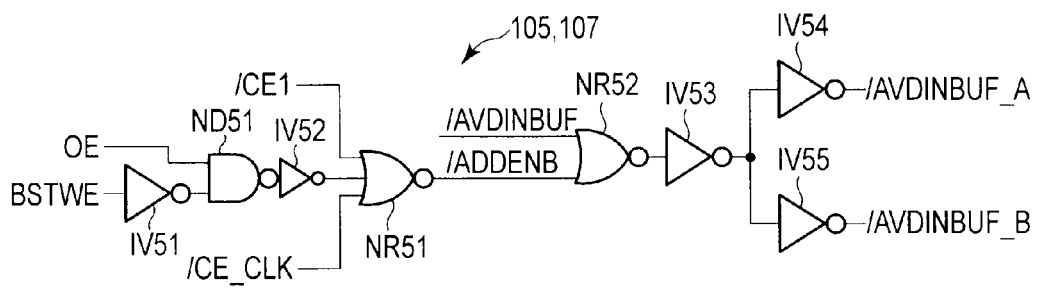
FIG. 8 illustrates a circuit diagram of a logic circuit and a switching circuit of the first embodiment.

FIG. 8 illustrates a circuit diagram of the logic circuit 105 and the switching circuit 107. As shown in FIG. 8, the signal OE is input to a NAND gate ND51. The signal BSTWE is input to a NAND gate ND51 via an inverter circuit IV51. The output of the NAND gate ND51 is input to a NOR gate NR51 via an inverter circuit IV52. The NOR gate NR51 also receives the signals /CE1 and /CE_CLK. The output of the NOR gate NR51 is input to a NOR gate NR52 as the signal /ADDENB. The NOR gate NR52 also receives the signal /AVDINBUF. The output of the NOR gate NR52 is input to inverter circuits IV54 and IV55 via an inverter circuit IV53. The outputs of the inverter circuits IV54 and IV55 serve as the signals /AVDINBUF_A and /AVDINBUF_B, respectively.

FIG. 9 illustrates a circuit diagram of the delay circuit 106. As shown in FIG. 9, the signal CE_DLY is input to an inverter circuit IV61. The output of the inverter circuit IV61 serves as the signal CE1. The output of the inverter circuit IV61 is input to a NAND gate ND61 via serially-coupled inverter circuits IV62 of a predetermined number (e.g., 15). The NAND gate ND61 also receives the signal CE_DLY. The output of the NAND gate ND61 serves as the signal /CE1 after it passes through an inverter circuit IV63.

FIG. 10 illustrates a circuit diagram of the address & data input circuit 108. As shown in FIG. 10, the signal PADADQ input from the pad is input to an ESD device ESD7. The output of the ESD device ESD7 is input to a NAND gate ND71. The signal /AVDINBUF_A/B is input to an inverter circuit IV71. The output of the inverter circuit IV71 is input to a NAND gate ND71. The output of the NAND gate ND71 is input to a NAND gate ND72. The NAND gate ND72 also receives the output of the inverter circuit IV71. The output of the NAND gate ND72 serves as the signal ADQ after it passes through serially-coupled inverter circuits IV72 of a predetermined number (e.g., two).

Figure 11:
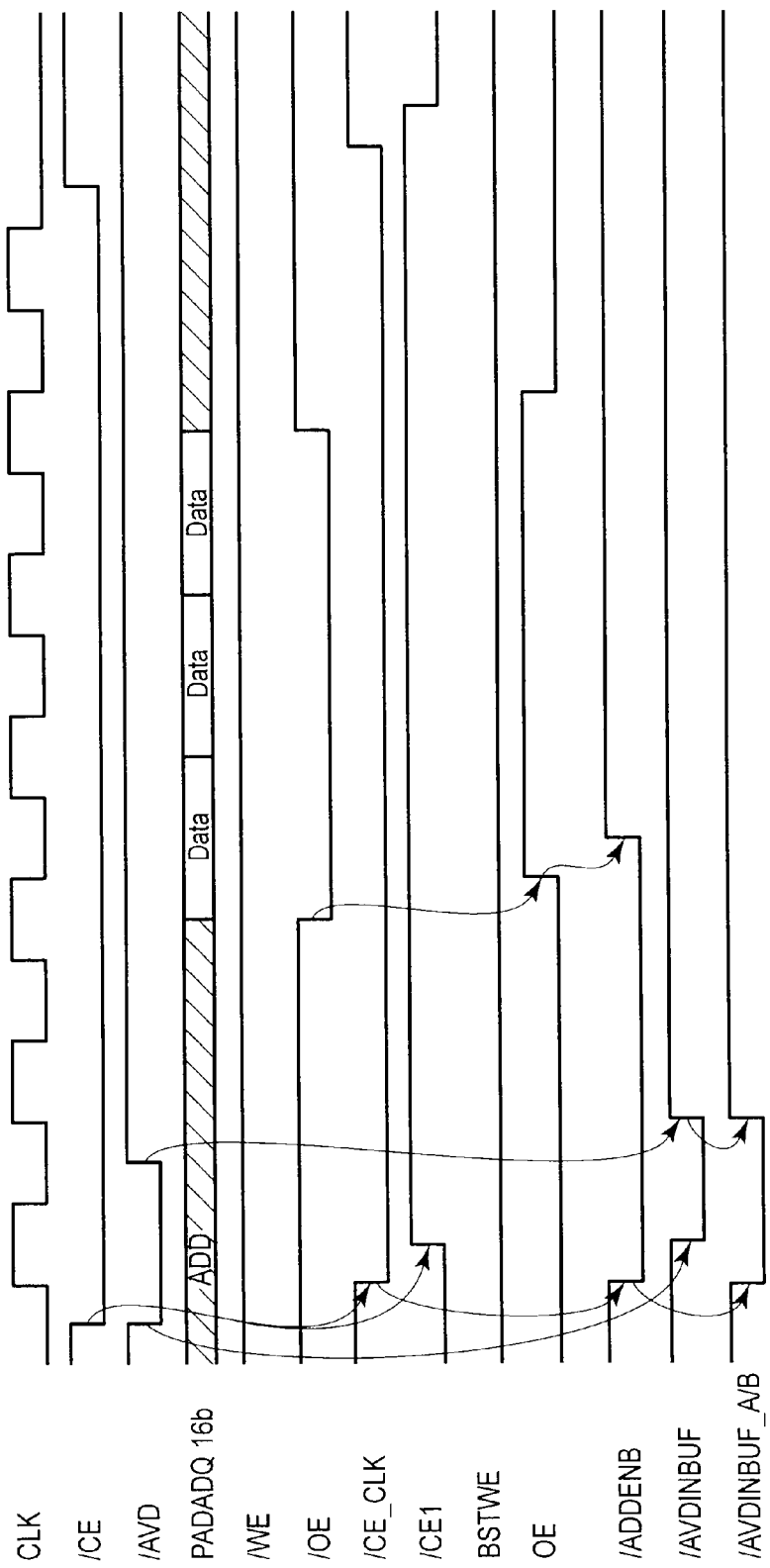
FIG. 11 illustrates a timing chart of signals in the interface in data reading.

A description will now be given of the synchronous data reading by the interface of the memory system 1 with reference to FIG. 11. FIG. 11 is a timing chart of signals in the interface in the synchronous data reading according to one embodiment. As shown in FIG. 11, the clock CLK is input to the interface 43 from the outside of the memory system 1. The clock has a cycle. The signal /CE from the outside of the memory system 1 is inactive (high) in the standby. The signal /WE also remains inactive (high) in the data reading. Therefore, the signal BSTWE is also inactive (low).

First, the signals /CE and /AVD become active (low). After the elapse of time defined by the /CE input circuit 101 from the activation of the signal /CE, the signal /CE_CLK transitions to low.

Responding to the signal CE_CLK having transitioned to low, the signal /ADDENB becomes active (low) by the logic circuit 105 and switching circuit 107. At this time, signal CE1 is low and the switching circuit 107 keeps outputting the input /ADDENB as the signal /AVDINBUF based on the low-level signal CE1. For this reason, the signal /AVDINBUF_A/B becomes active (low) in response to the signal /ADDENB having transitioned to low. As a result, the address & data input circuit 108 is enabled, and the signal PADADQ can now be taken in by the address & data input circuit 108. With an address input as the signal PADADQ from the start of the data reading, the address is output from the address & data input circuit 108 as the signal ADQ. Thus, the activation of the signal /CE allows time for which the address & data input circuit 108 can remain enabled to be defined by the delay circuit 106 and controlled by the signal /CE1 without requiring activation of the signal /AVD.

The signal /CE1 becomes inactive (high) after the elapse of a predetermined period from the activation of the signal /CE. The time taken for the signal /CE1 becoming inactive from the activation of the signal /CE is defined by the /CE input circuit 101 and delay circuit 106. Responding to the signal /CE1 having transitioned to high, the switching circuit 107 keeps outputting the input /AVDINBUF as the signal /AVDINBUF.

Responding to the activation of the signal /AVD before, the signal /AVDINBUF becomes active (low) by the /AVD input circuit 102. Subsequently, the signal /AVD becomes inactive (high) with the completion of the input of the address. Responding to the inactivation of the signal /AVD, the signal /AVDINBUF becomes inactive (high) by the /AVD input circuit 102. At this time, since the switching circuit 107 has been selecting the input /AVDINBUF as described above, the signal /AVDINBUF_A/B becomes inactive (high) in response to the inactivation of the signal /AVDINBUF. As a result, the address & data input circuit 108 is disabled. For this reason, although /ADDENB is still active, the signal PADADQ is not output from the address & data input circuit 108 as the signal ADQ any longer.

With the start of the data supplied to the interface 43 from a component within the memory system 1, the signal /OE becomes active (low). The signal OE transitions to high after the elapse of a predetermined period defined by the /OE input circuit 103 from the inactivation of the signal /OE. Responding to the signal OE having transitioned to high, the signal /ADDENB becomes inactive (high) by the logic circuit 105 and the switching circuit 107.

Responding to the activation of the signal /OE, the data from a component within the memory system 1 appears on PADADQ, and it is output from the pad. Subsequently, the signal /OE becomes inactive (high) with the completion of the data output. Responding to the inactivation of the signal /OE, the signal OE becomes low.

The signal /CE becomes inactive after the completion of the data output. Responding to the inactivation of the signal /CE, the signals /CE_CLK and CE1 sequentially transition to high and low, respectively. Thus, the memory system 1 returns to the standby state.

Figure 12:
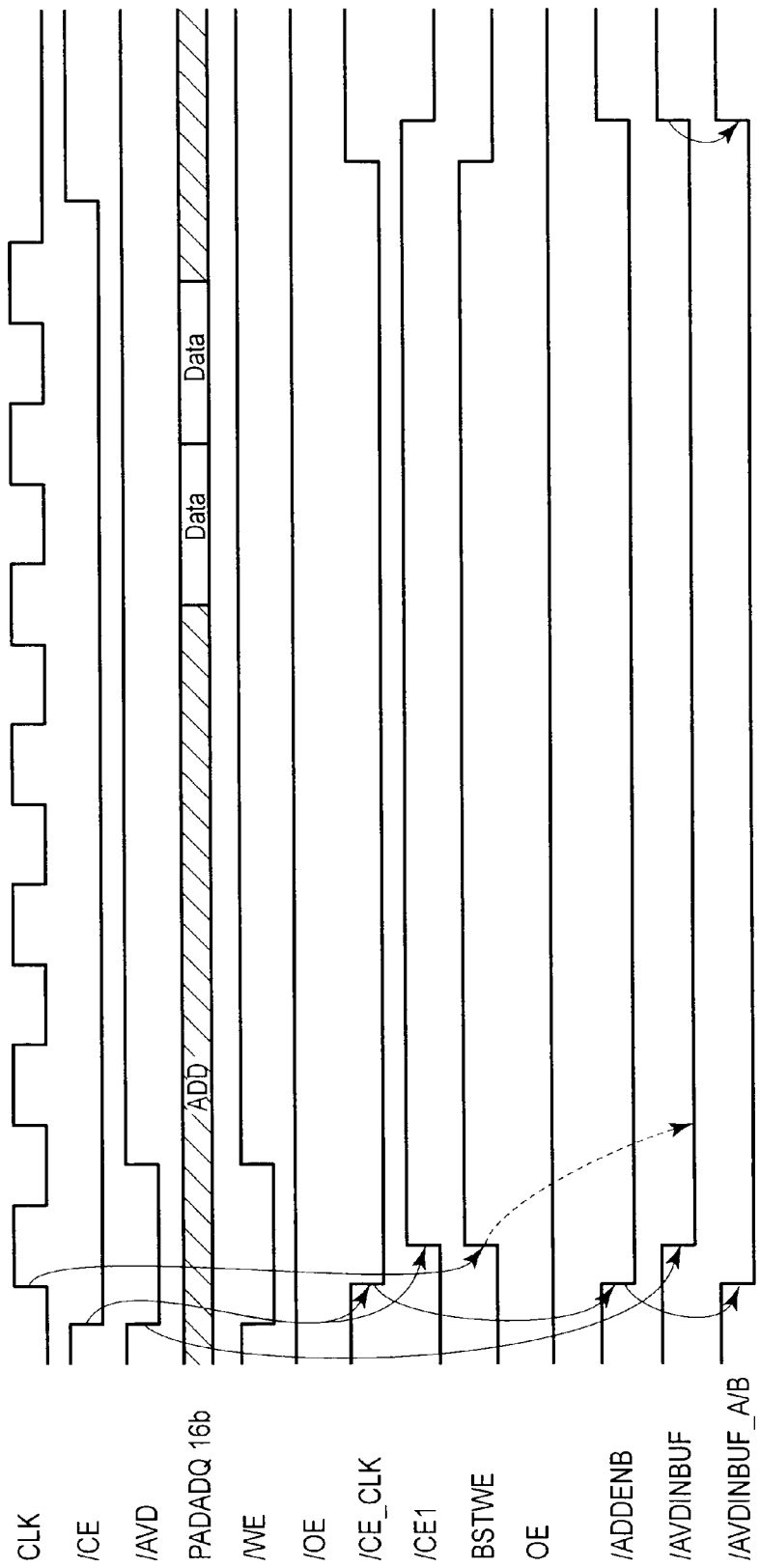
FIG. 12 illustrates a timing chart of signals in the interface of the first embodiment in data writing.

A description will now be given of the synchronous data writing by the interface of the memory system 1 with reference to FIG. 12. FIG. 12 is a timing chart of signals in the interface in the synchronous data writing according to one embodiment. As shown in FIG. 12, the signal /OE remains inactive during the data writing.

First, the signals /CE, /AVD, and /WE become active (low). Responding to the activation of the signal /CE, the signal /CE_CLK transitions to low as in the data reading.

Responding to the signal /CE_CLK having transitioned to low, the signal /ADDENB transitions to low as in the data reading. Responding to the signal /ADDENB having transitioned to low, the signal /AVDINBUF_A/B in turn becomes active (low) as in the data reading. As a result, with the same mechanism as the data reading, the address & data input circuit 108 is enabled, which allows the address & data input circuit 108 to take in the signal PADADQ. With an address input as the signal PADADQ from the start of the data writing, the address is output from the address & data input circuit 108 as the signal ADQ. Thus, the activation of the signal /CE allows the time for which the address & data input circuit 108 can remain enabled to be defined by the delay circuit 106 and is controlled by the signal /CE1 without requiring the activation of the signal /AVD, as in the data reading.

Responding to the activation of the signal /CE before, the signal /CE1 transitions to high by the same mechanism as in the data reading. Moreover, responding to the inactivation of the signal /AVD before, the signal /AVDINBUF becomes active (low) by the same mechanism as in the data reading.

Responding to the first rising of the clock CLK after the activation of the signal /CE, the active (low) signal /WE is taken in by the latch circuit L in the /WE input circuit 104. As a result, the signal BSTWE becomes active (high).

The signal /AVD becomes inactive (high) with the completion of the input of the address. Even after the signal /AVD becomes inactive, the signal /AVDINBUF remains low unlike in the data reading because the signal BSTWE is high. Since the signal /AVDINBUF selected by the switching circuit 107 remains low, the signal /AVDINBUF_A/B also remains low. Therefore, the address & data input circuit 108 remains enabled, and the signal PADADQ keeps being taken in by the address & data input circuit 108 even after the signal /AVD transitions to high. Data then starts to be input as the signal PADADQ. Since the address & data input circuit 108 is enabled, the data is output from the address & data input circuit 108 as the signal ADQ.

The signal /CE then becomes inactive after the completion of the data input. Responding to the inactivation of the signal /CE, the signals /CE_CLK and /CE1 sequentially transition to high and low, respectively. Responding to the inactivation of the signal /CE, the /WE input circuit 104 is disabled. As a result, the signal BSTWE transitions to low.

Responding to the inactivation of the signal /CE, the /AVD input circuit 102 and logic circuit 105 are also disabled. As a result, the signals /ADDENB and /AVDINBUF become inactive (high). Responding to the signals /ADDENB and /AVDINBUF having transitioned to high, the signal /AVDINBUF_A/B transitions to high. Thus, the memory system 1 returns to the standby state.

As already described, in the first embodiment the signal /AVDINBUF_A/B for controlling enabling of the address & data input circuit 108 is the signal /ADDENB for a predetermined period from the activation of the signal /CE and is the signal /AVDINBUF after the elapse of this period. The signal /ADDENB becomes active in response to the activation of the signal /CE regardless of the signal /AVD, and the signal /AVDINBUF follows the signal /AVD. For this reason, the address & data input circuit 108 is enabled for a predetermined period from the activation of the signal /CE regardless of the signal /AVD, and is enabled and disabled based on the signal /AVD after the elapse of the predetermined period. Therefore, without waiting for the activation of the signal /AVD from the activation of the signal /CE, the address & data input circuit 108 can be enabled, and it can be enabled and disabled as usual by the signal /AVD after the elapse of the predetermined period. Thus, the operation of the semiconductor memory device can be accelerated, in particular right after the activation of the signal /CE. Since the address & data input circuit 108 can be enabled and disabled by the signal /AVD after the elapse of the predetermined period from the activation of the signal /CE, the penetration current due to unnecessary and unexpected signal PADADQ is prevented.

(Second Embodiment)

In the first embodiment the signal BSTWE is generated from the write enable signal /WE, and the logic circuit 105 is controlled by the signal BSTWE. In contrast, a signal BSTWE' is generated from the write enable signal /WE, and the logic circuit 105 is controlled by the signal BSTWE' in the second embodiment. Any description on the first embodiment also applies to the second embodiment except for features described below.

FIG. 13 is a block diagram of an interface of a semiconductor memory device according to the second embodiment. As shown in FIG. 13, the /WE input circuit 104 of the first embodiment is replaced with a /WE input circuit 104'. The /WE input circuit 104' is enabled by the active signal CE_WE. The /WE input circuit 104' also receives the write enable signal /WE from the outside of the memory system 1. When the enabled /WE input circuit 104 receives the signal /WE, it latches the signal /WE and outputs the latched signal as the signal BSTWE' after the elapse of a predetermined period. The signal BSTWE of the first embodiment is replaced with the signal BSTWE' to be input to the /AVD input circuit 102 and logic circuit 105. Alternatively, the /WE input circuit 104' operates identically to the /WE input circuit 104 of the first embodiment. It is selected by a control signal which one of such two types of operation the /WE input circuit 104' performs. Configurations other than those described so far remain the same as in the first embodiment.

FIG. 14 illustrates a circuit diagram of the /WE input circuit 104'. As shown in FIG. 14, the /WE input circuit 104' includes the WE input circuit 104. The WE input circuit 104' also includes a component coupled to the output of an inverter circuit IV41, which is also the output of the /WE input circuit 104. The signal BSTWE is input to a switching circuit S1 and a logic circuit f1. The clock CLK is also input to a latency counter C1. The latency counter C1 starts outputting a received signal after the elapse of a predetermined period from the start of reception of an input (the clock CLK). This predetermined period can be the predetermined latency period-1 clocks, and the latency period is defined by the latency counter C1. The output of the latency counter C1 is input to the logic circuit f1. The logic circuit f1 outputs a predetermined logic obtained from the outputs of the signal BSTWE and latency counter C1. The output of the logic circuit f1 is input to the switching circuit S1. The switching circuit S1 outputs one of the two inputs as the signal BSTWE' based on a control signal SS. The control signal SS is based on a configuration register preset in a chip of the memory system 1, and is not changed during use of the memory system 1. For example, the switching circuit S1 outputs the signal BSTWE as the signal BSTWE' if the memory system 1 is used as the asynchronous type, which is completely the same as in the first embodiment. In contrast, the switching circuit S1 outputs the output of the logic circuit f1 as the signal BSTWE' if the memory system 1 is used as the synchronous type.

Examples of the /AVD input circuit 102 and logic circuit 105 are the same as in the first embodiment (FIG. 5 and FIG. 8) as shown in FIG. 15 and FIG. 16, respectively, except for the signal BSTWE replaced with the signal BSTWE'.

Among operations, the data reading is the same as in the first embodiment (FIG. 11). The data writing is also the same as in the first embodiment (FIG. 12) in the asynchronous type use as described above.

Figure 17:
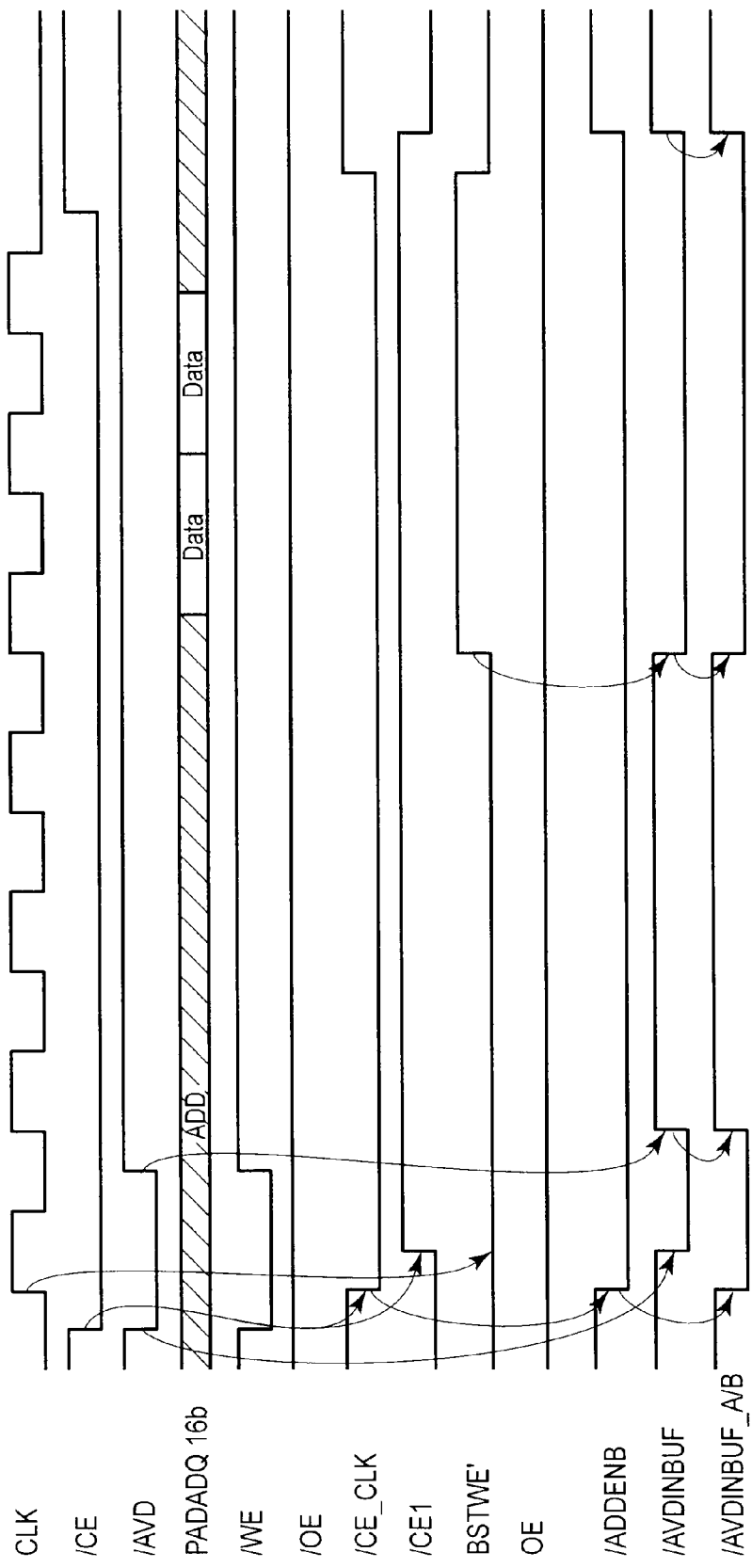
FIG. 17 is a timing chart of signals in an interface of a second embodiment in data writing.

In contrast, the synchronous type use is as shown in FIG. 17. FIG. 17 is a timing chart of signals in the interface in data writing. The active signal /WE is latched by the latch circuit L of FIG. 14 upon the first rising of the clock CLK after the activation of the signal /CE as in the first embodiment. The latched signal, however, is not immediately output from the /WE circuit 104' unlike in the first embodiment. Therefore, the signal BSTWE' remains inactive (low) even after the first rising of the clock CLK after the activation of the signal /CE as shown in FIG. 17. Thus, the period from the activation of the signal /CE to transitioning of the signal BSTWE' to high is longer when the memory system 1 is used as the synchronous type than as the asynchronous type.

Responding to the activation of the signal /CE, the signal AVDINBUF_A/B becomes active to enable the address & data circuit 108 by the same mechanism as in the first embodiment. Therefore, with an address input as the signal PADADQ from the start of the data writing, the address is output from the address & data input circuit 108 as the signal ADQ.

The signal /AVD becomes inactive (high) with the completion of the address input. Since the signal BSTWE' is inactive, the signal /AVDINBUF becomes inactive (high) by the /AVD input circuit 102 in response to the inactivation of the signal /AVD. At this time, the switching circuit 107 has been selecting the input /AVDINBUF. Therefore, the signal /AVDINBUF_A/B transitions to high in response to the signal /AVDINBUF having transitioned to high. As a result, the address & data input circuit 108 is disabled.

After the elapse of time defined by the latency counter C1 from the first rising of the clock CLK after the activation of the signal /CE, the signal BSTWE' becomes active in response to the activation of the signal /WE. Responding to the activation of the signal BSTWE', the signal /AVDINBUF becomes active and in turn the signal /AVDINBUF_A/B also becomes active. As a result, the address & data input circuit 108 is enabled.

The latency counter C1 is set to allow the signal BSTWE' to transition to high before the data is input as the signal PADADQ. For this reason, after the signal BSTWE' transitions to high, the data starts to be input as the signal PADADQ. Since the address & data input circuit 108 is enabled, the data is output from the address & data input circuit 108 as the signal ADQ. Operations other than those described so far remain the same as in the first embodiment.

As described, in the second embodiment the signal /AVDINBUF_A/B for controlling enabling of the address & data input circuit 108 is the signal /ADDENB for a predetermined period from the activation of the signal /CE and is the signal /AVDINBUF after the elapse of the period as in the first embodiment. Therefore, the same advantages as in the first embodiment can be obtained.

Furthermore, after the elapse of the predetermined period from the first rising of the clock CLK after the activation of the signal /CE, the signal BSTWE' becomes active in response to the activation of the signal /WE in the second embodiment. This predetermined time continues from the activation of the signal /CE until just before the input of data to the interface 43 from the outside, in particular when the memory system 1 is used as the synchronous type. The signal /AVDINBUF follows the signal /AVD while the signal BSTWE' is low. That is, after the inactivation of the signal /AVD, the address & data input circuit 108 is disabled until the signal BSTWE' transitions to high. For this reason, the address & data input circuit 108 is disabled from the inactivation of the signal /AVD until the data input. Therefore, the penetration current due to unnecessary and unexpected signal PADADQ is also prevented from flowing between the inactivation of the signal /AVD and the data input.

The description has been made with reference to a so-called One NAND as an example for a semiconductor memory device. Embodiments, however, are not limited to the One NAND but are applicable to semiconductor memory devices which include a controller and the NAND flash memory and require a high-speed interface. Such semiconductor memory devices include the NOR type flash memory, pseudo static random access memory (PSRAM), low power synchronous dynamic random access memory (LPSDRAM), double-data-rate 3 synchronous dynamic random access memory (DDR3 SDRAM), etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell; and
an interface which comprises:
   a first input circuit which outputs an active first internal signal in response to an active first control signal received by the semiconductor memory device;
   a second input circuit which outputs an active second internal signal in response to an active second control signal received by the semiconductor memory device while the semiconductor memory device is receiving the active first control signal;
   a delay circuit which outputs a selection signal in a first state or a second state after the elapse of a first period from when the first control signal becomes inactive or active, respectively;
   a selection circuit which outputs the first internal signal as an enable signal while receiving the selection signal of the first state, and outputs the second internal signal as the enable signal while receiving the selection signal of the second state; and
   a third input circuit which outputs an input signal received from the outside of the semiconductor memory device from the interface to the inside of the semiconductor memory device while receiving the active enable signal.

2. The device of claim 1, wherein
the first input circuit outputs the inactive first internal signal in response to an active third control signal received by the semiconductor memory device while the semiconductor memory device is receiving the active first control signal.

3. The device of claim 2, further comprising:
a fourth input circuit which outputs a signal determined and delayed based on the active third control signal while the fourth input circuit is receiving the selection signal of the first state.

4. The device of claim 1, wherein
the second input circuit outputs the active second internal signal in response to an active fourth control signal received by the semiconductor memory device while the semiconductor memory device is receiving the active first control signal.

5. The device of claim 4, further comprising:
a fifth input circuit which latches a value of the fourth control signal in response to a first rising of a clock after the first control signal becomes active and outputs the latched signal as a fifth control signal while the semiconductor memory device is receiving the active first control signal.

6. The device of claim 5, wherein
the second input circuit outputs the second internal signal in a state determined based on the second control signal while receiving an inactive fifth control signal.

7. The device of claim 6, wherein
the second input circuit outputs the active second internal signal while receiving the active fifth control signal.

8. The device of claim 4, wherein
the second input circuit outputs the active second internal signal after the elapse of a second period from the active fourth control signal received by the semiconductor memory device while the semiconductor memory device is receiving the active first control signal.

9. The device of claim 8, further comprising:
a fifth input circuit which latches a value of the fourth control signal in response to a first rising of a clock after a first control signal becomes active and outputs the latched signal after the elapse of a third period from a first rising of the clock while the semiconductor memory device is receiving the active first control signal.

10. The device of claim 9, wherein
the second input circuit outputs the second internal signal in a state determined based on the second control signal while receiving an inactive fifth control signal.

11. The device of claim 10, wherein
the second input circuit outputs the active second internal signal while receiving the active fifth control signal.

12. The device of claim 8, wherein
the second input circuit outputs the active second internal signal after the elapse of a third period or a fourth period longer than the third period from the active fourth control signal received by the semiconductor memory device while the semiconductor memory device is receiving the active first control signal, and
the third or fourth period is determined based on whether the semiconductor memory device is set as a synchronous or asynchronous operation type.

13. The device of claim 1, further comprising:
a pad which receives signals to the interface and receives an address or a data signal as the input signal.

* * * * *